United States Patent [19]
Boutros et al.

[11] Patent Number: 6,102,741
[45] Date of Patent: Aug. 15, 2000

[54] COMMON MODE FILTER CONNECTOR WITH ISOLATION

[75] Inventors: Kamal Shawiky Boutros, Richmond Hill; Bonita Lynn Rose, Toronto, both of Canada

[73] Assignee: Amphenol Corporation, Wallingford, Conn.

[21] Appl. No.: 08/866,107

[22] Filed: May 30, 1997

Related U.S. Application Data

[63] Continuation-in-part of application No. 08/657,209, Jun. 3, 1996, Pat. No. 5,872,492.

[51] Int. Cl.[7] .................................................. H01R 13/66
[52] U.S. Cl. ......................... 439/620; 439/676; 336/107
[58] Field of Search ................................ 439/620, 76.1, 439/676; 336/107, 65, 92

[56] References Cited

U.S. PATENT DOCUMENTS

| | | |
|---|---|---|
| 4,754,370 | 6/1988 | DeTizio et al. ............................ 336/65 |
| 5,403,200 | 4/1995 | Chen ........................................ 439/676 |
| 5,687,233 | 11/1997 | Loudermilk et al. . | |
| 5,736,910 | 4/1998 | Townsend et al. . | |
| 5,833,496 | 11/1998 | Hollander et al. ....................... 439/620 |
| 5,872,492 | 2/1999 | Boutros .................................... 439/620 |

*Primary Examiner*—Paula Bradley
*Assistant Examiner*—Katrina Davis
*Attorney, Agent, or Firm*—Blank Rome Comisky & McCauley, LLP

[57] ABSTRACT

A circuit board mounted electrical connector includes a main housing, a secondary housing containing transformer and/or filter components, means for securing the main housing to the secondary housing, and terminal structures for connecting the windings of the transformer and/or filter components to the connector mating contacts and to each other. The mating contacts and the terminal structures may be mounted together on a base module, on an extension of the secondary housing, or separately on the base and on an extension of the secondary housing, while the transformer and/or filter components can be mounted in the secondary housing in a variety of orientations.

20 Claims, 9 Drawing Sheets

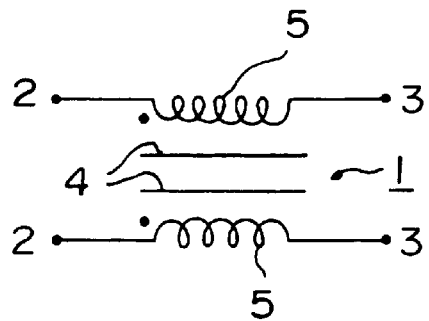
FIG. IA
(PRIOR ART)
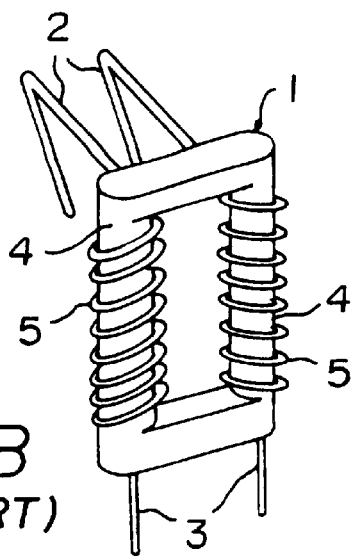
FIG. IB
(PRIOR ART)
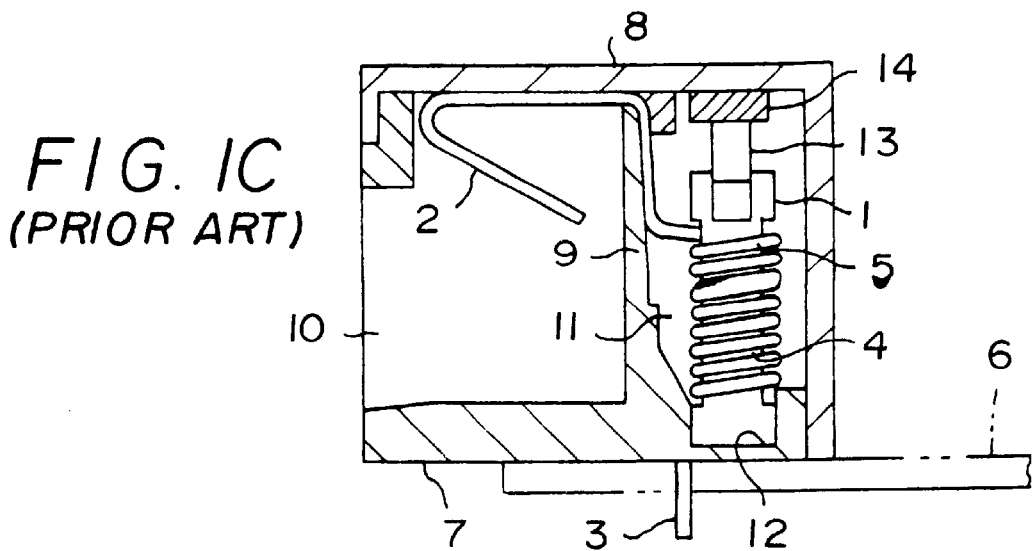
FIG. IC
(PRIOR ART)

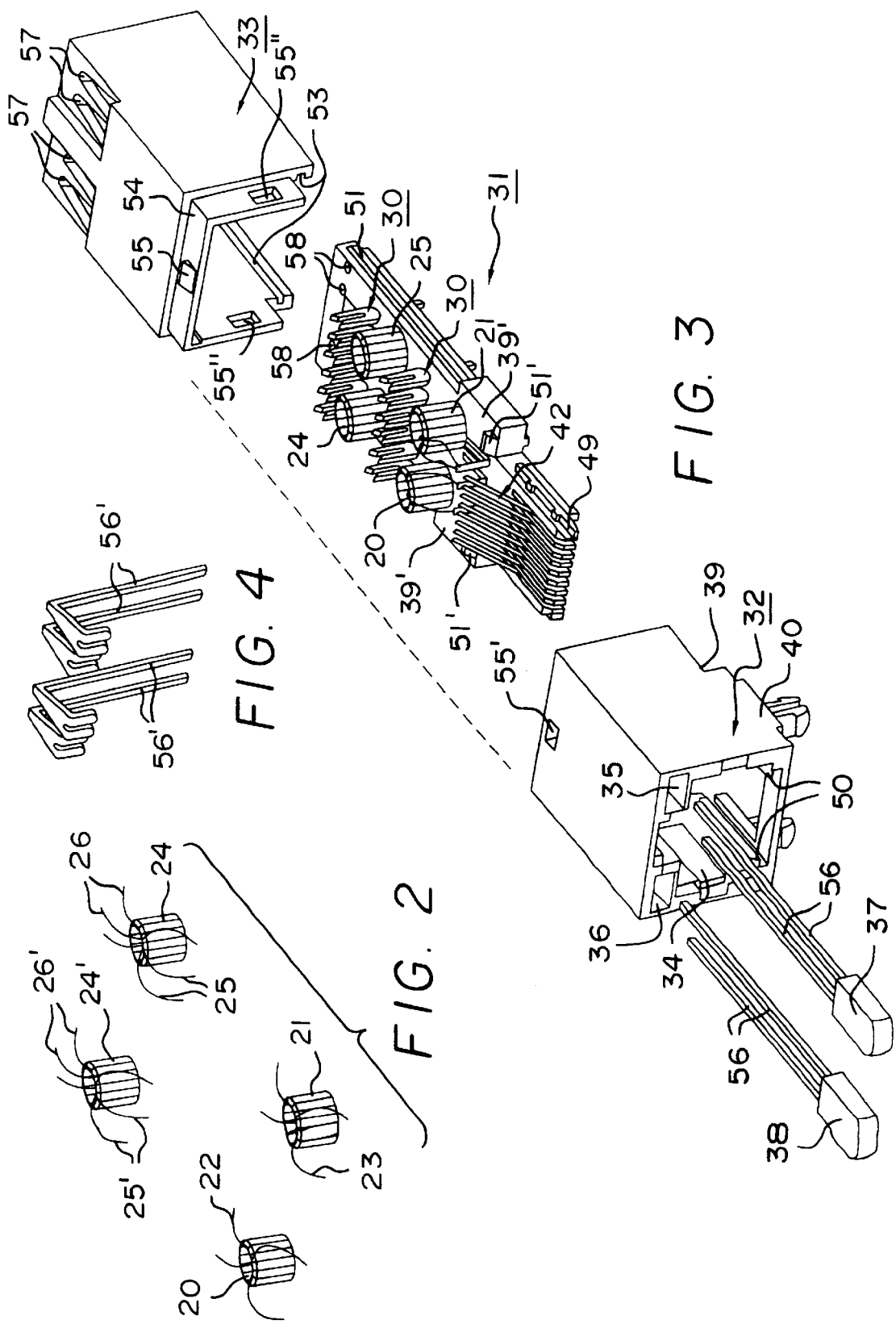

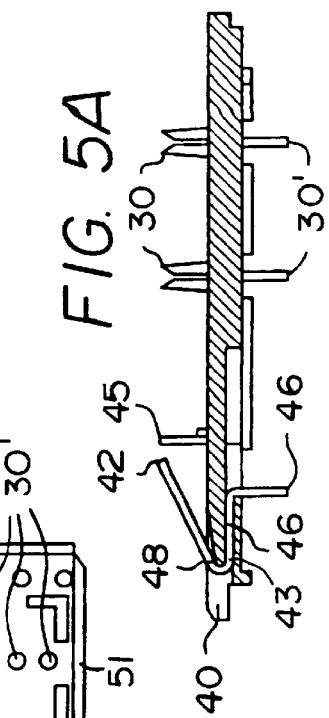
FIG. 5G
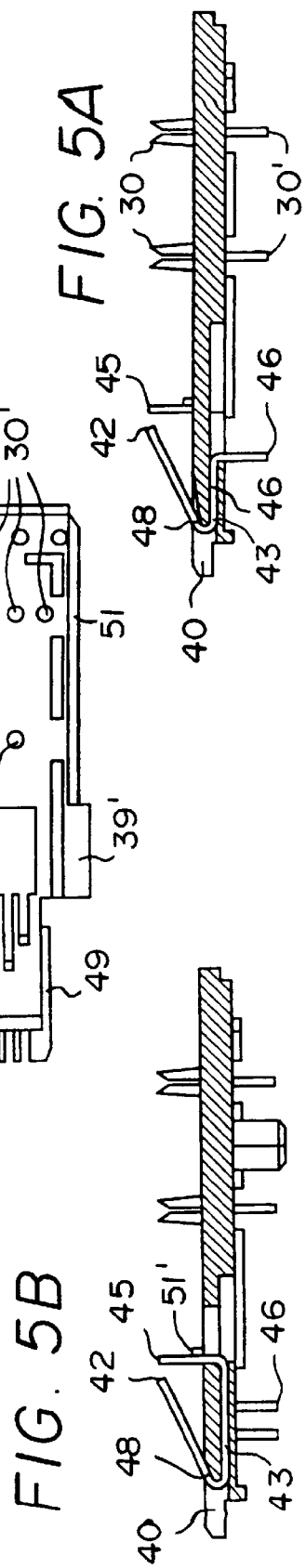
FIG. 5A
FIG. 5E
FIG. 5B
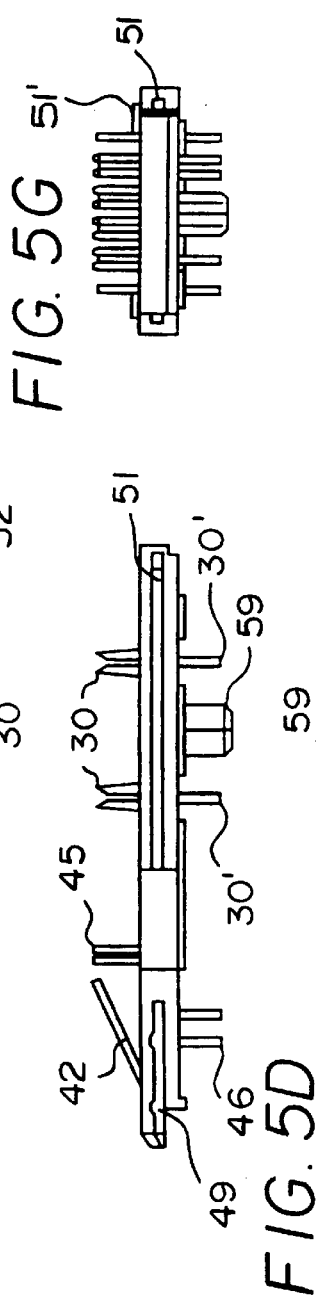
FIG. 5C
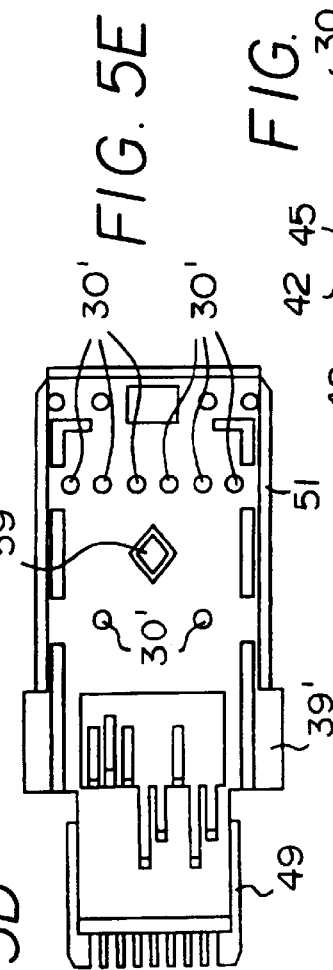
FIG. 5D
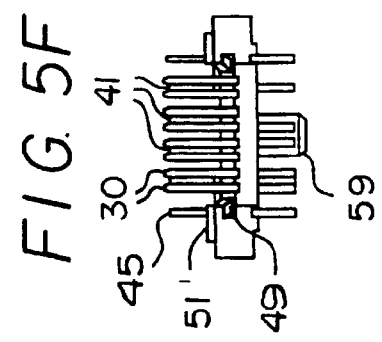
FIG. 5F

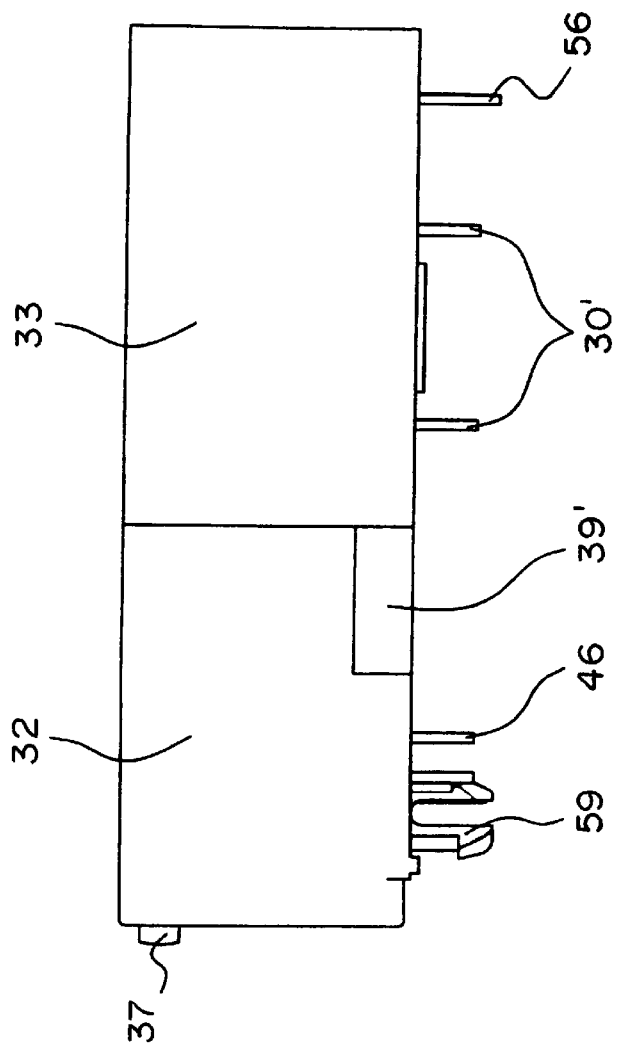
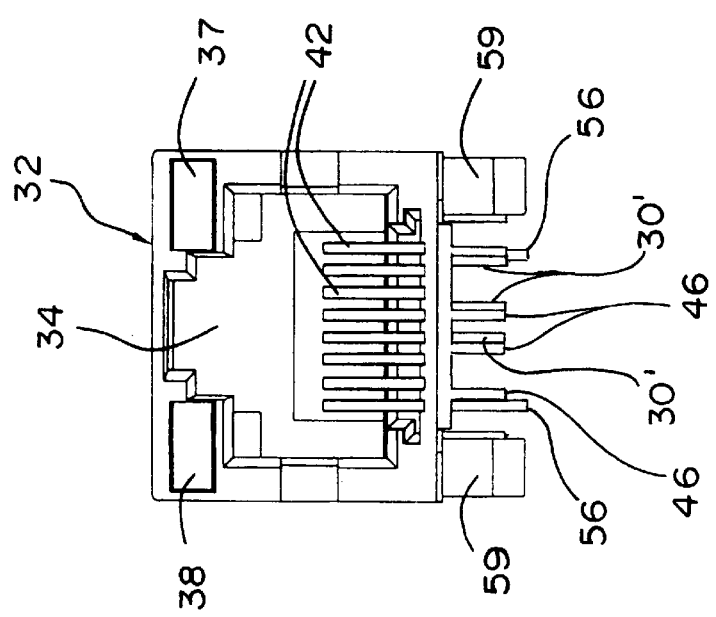

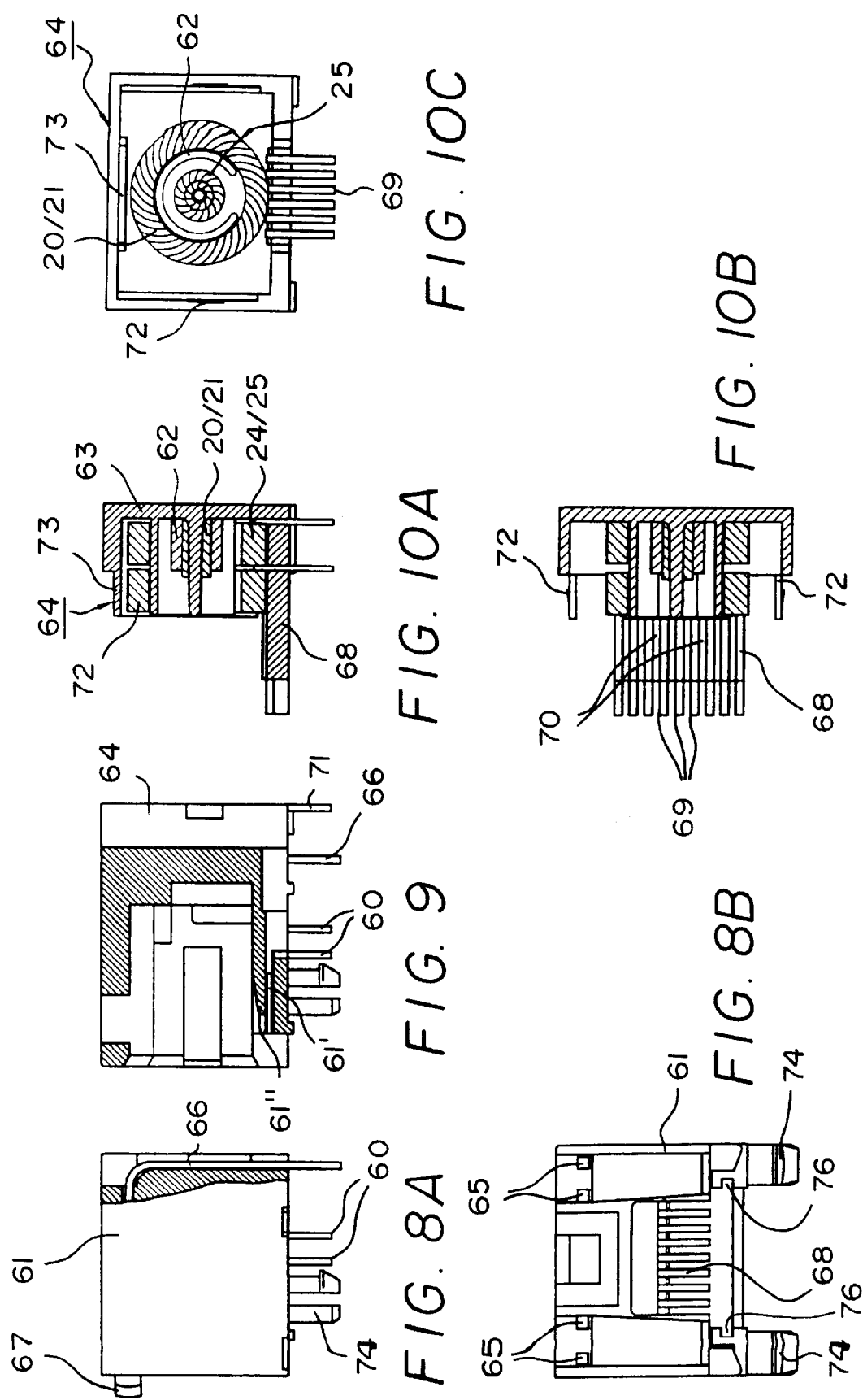

COMMON MODE FILTER CONNECTOR WITH ISOLATION

This application is a continuation-in-part of U.S. patent application Ser. No. 08/657,209, filed Jun. 3, 1996, U.S. Pat. No. 5,872,492.

BACKGROUND OF THE INVENTION

1. Field of the Invention

This invention relates to an electrical connector, and in particular to a circuit board mounted electrical connector which includes a main housing, a secondary housing containing transformer and/or filter components, means for securing the main housing to the secondary housing, and terminal structures for connecting the windings of the transformer and/or filter components to the connector mating contacts and to the circuit board.

2. Description of Related

Electrical connectors known as modular phone receptacles or jacks have been known for many years. Although connectors of this type were originally designed for use in telephone systems, they have found wide acceptance in a variety of other contexts. For example, modular jacks are now commonly used as input/output (I/O) interface connectors for enabling computers to communicate with each other and with a variety of peripheral equipment, and in particular as connectors between a local area network (LAN) and an appropriately configured interface card.

In order to receive a corresponding modular plug, the conventional modular jack is generally made up of a socket housing which includes a plug-receiving opening, opposed top and bottom surfaces joined by opposed side surfaces extending from the opening to a back surface, and a plurality of stamped, metallic elongated contacts mounted in the housing for engaging contacts of the corresponding plug. Each contact in this type of connector includes a contact mating portion at one end extending diagonally into the socket, a vertically extending lead portion at the other end, and a horizontally extending intermediate portion between the contact mating portion and the lead portion. Generally, the lead portions of the contacts are inserted directly into openings in the interface card and soldered in place.

Because the above-described type of modular jack is often used for digital communications, the devices in which this type of connector is used have a tendency to emit high frequency radiation which can interfere with other electrical equipment. In addition, the devices are themselves vulnerable to noise or transients induced in an incoming line by external sources. While adding filtering circuitry to the interface card can often be used to solve such problems, the difficulty of designing circuitry Which masts current emissions requirements as well as space considerations suggests that inclusion of filtering or transient suppression capabilities in the connector would be desirable under certain circumstances, and in particular where the cost of providing on-board filtering exceeds the cost of adding filters to the connector.

In general, prior attempts to add common mode filtering to interface connectors for LANs and similar applications have fallen into one of three categories:

1.) connectors in which the filter components are provided on a miniature circuit board fitted into or onto the connector, as described in U.S. Pat. No. 5,069,641 (Sakamoto et al.), or on circuit board traces applied directly to the connector, as described in U.S. Pat. No. 5,282,759 (Sakamoto et al.);

2.) connectors in which the connector contacts are inserted through central openings in a ferrite block which forms the inductive component of the common mode filter, as described in U.S. Pat. Nos. 4,772,224 (Briones) and 5,397,250 (Talend); and 3.) connectors in which the contacts are wrapped around the filter components, as described in U.S. Pat. Nos. 5,015,204 (sakamoto et al.) and 5,139,442 (Sakamoto et Filters of the first type, in which the circuitry is provided on a printed circuit board, have the disadvantage that they are relatively expensive in comparison with corresponding circuitry mounted on a host interface card or circuit board, due to the limited space available within the standard connector and the consequent need for miniaturization. Filters of the second and third types, on the other hand, are simpler to install and use less expensive components, but have the disadvantage of failing to offer electrical isolation between input and output circuits, as a result of which the isolation circuitry must still be provided on the host circuit card.

FIGS. 1A–1C show a typical example of the third type of prior art filtering arrangement mentioned above, in which the common mode filter is formed by wrapping the connector contacts around a ferrite core, as disclosed in U.S. Pat. No. 5,015,204. The prior arrangement provides an inductive core 1, which is positioned at the rear of an RJ connector, and contacts that extend from a first end, the first end being in the form of a front mating interface portion 2 arranged to engage corresponding portions of the contacts of an RJ connector plug, to a second end which forms PCB tails 3 for insertion into openings in a printed circuit board 6. In order to form the common mode filter, the electrical schematic for which is illustrated in FIG. 1A, the contacts are wrapped around legs 4 of the inductive coil 1 to form coils 5.

In order to accommodate the filter, the conventional arrangement requires modification of the connector by constructing the connector of a lid member 8 and a base member 7 having an extension 9 which separates the interior of the connector into a plug receiving chamber 10 and a filter accommodating chamber 11. The filter is positioned in the chamber 11 by a cavity 12 provided in the base member 7, and held in place by a pressure bar spring 13 itself positioned in a positioning member 14 depending from the lid member 8 or upper half of the connector housing.

As indicated above, the disadvantage of this arrangement is that it cannot accommodate both the common mode filter and isolation circuitry, and thus it has conventionally been necessary to include a transformer on the interface card, or eliminate conventional components in favor of circuit traces at the rear of the connector and a prepackaged miniature transformer of the type described, for example, in U.S. Pat. No. 5,403,207.

Parent application Ser. No. 08/657,209 solved this problem by including within the connector both a common mode filter and an isolating transformer, both of which are made of components, and by separating the mating portion of the contact structure from the terminals extending from the connector to form the connection to circuits an the card on which the connector is mounted. However, in the preferred embodiment illustrated in the parent application, the mating contacts were formed by extending the inductor windings to form the contacts, and the PCB tails were in the form of extensions of the transformer windings. While the description of the preferred embodiment mentioned the possibility of connecting the windings of the transformer and the filter by terminating the windings to the circuit board on which the connector is mounted, separate terminals for the windings were not provided.

The present invention, on the other hand, extends the concepts disclosed in the parent application by replacing the mating contact and PCB tail structures of the parent application by separate mating contact and PCB tail structures. Instead of forming contact tails from the windings, the contact tails are incorporated into the base of the housing structure, and the ends of the windings on the transformer and inductor cores are connected to fixed terminals extending from the base of the housing and connected respectively to the contact tails and the connector contacts.

The arrangement disclosed herein simplifies assembly of the connector employing the broad principles described in the parent application by allowing the filter and transformer components to be pre-wound and connected to the base before assembly of the base to the connector, while increasing design flexibility because the terminal pattern and interconnections between the terminals can easily be varied without varying the housing footprint or the component mounting arrangement The present invention thus uses the concept disclosed in the parent application of separating the front portion of the RJ contact structure from the portion which extends from the connector and is inserted into the host circuit board or interface card, but does so in a way which greatly simplifies assembly of the connector, while allowing the use of standard one piece ferrite core structures for the transformer and/or filter components.

SUMMARY OF THE INVENTION

It is accordingly an objective of the invention to provide an improved circuit board mounted connector which, like that of parent application Ser. No. 08/657,209, filed Jun. 3, 1996, is simple in structure and provides electrical isolation between the connector contacts and circuitry on the circuit board, but which permits use of pre-wound one-piece transformer and/or inductor core structures, and which is easily adaptable to a variety of housing and circuit configurations.

This objective of the invention is achieved by providing a circuit board mounted electrical connector which includes a main housing, a secondary housing containing transformer and/or filter components, means for securing the main housing to the secondary housing, and separate terminal structures for connecting the windings of the transformer and/or filter components to the connector mating contacts, to the PCB tails, and to each other.

According to various preferred embodiments of the invention, the mating contacts and the terminal structures may be mounted together on a base module, on an extension of the secondary housing, or separately on the base and on an extension of the secondary housing, while the electrical components can be mounted in the secondary housing in a variety of orientations.

In addition, in each of the preferred embodiments of the invention, the connector may be in the form of an RJ connector, for example a high speed RJ-45 connector of the type typically used on network or communications interface cards, although the principles of the invention could possibly be used in a variety of applications requiring a simplified circuit board mounted connector structure in which the connector includes isolating and filtering components.

BRIEF DESCRIPTION OF THE DRAWINGS

FIG. 1A is a schematic circuit diagram showing a conventional common mods filter.

FIG. 1B is a perspective view of a conventional implementation of the common mode filter of FIG. 1A.

FIG. 1C is cross-sectional side view or an RJ-type connector plug including the conventional common mode filter illustrated in FIG. 1B.

FIG. 2 is a perspective view of transformer and inductor structures suitable for use in connection with the preferred embodiments of the invention.

FIG. 3 is an exploded perspective view showing the various housing parts of a connector constructed in accordance with the principles of a first preferred embodiment of the invention.

FIG. 4 is a perspective view of LED lead extensions which may be incorporated into the preferred embodiments of the invention.

FIG. 5A is a cross-sectional side view taken along line B—B in FIG. 5C.

FIG. 5B is a cross-sectional side view taken along line A—A in FIG. 5C.

FIGS. 5C–5G are respective top, side, bottom, front, and rear views of the terminal supporting base illustrated in FIG. 3.

FIG. 6 is a front view of the assembled connector of the first preferred embodiment of the invention.

FIG. 7 is a side view of the assembled connector of the first preferred embodiment of the invention.

FIG. 8A is a partially cross-sectional side view of a main housing constructed in accordance with the principles of a second preferred embodiment of the invention.

FIG. 8B is a rear view of the main housing shown in FIG. 8A, with contacts removed.

FIG. 9 is a cross-sectional side view of an assembled connector constructed in accordance with the principles of the second preferred embodiment of the invention.

FIGS. 10A–10C are respective side, top, and front views of a secondary housing for the connector of second preferred embodiment of the invention.

DETAILED DESCRIPTION OF THE PREFERRED EMBODIMENT

Figure 12:
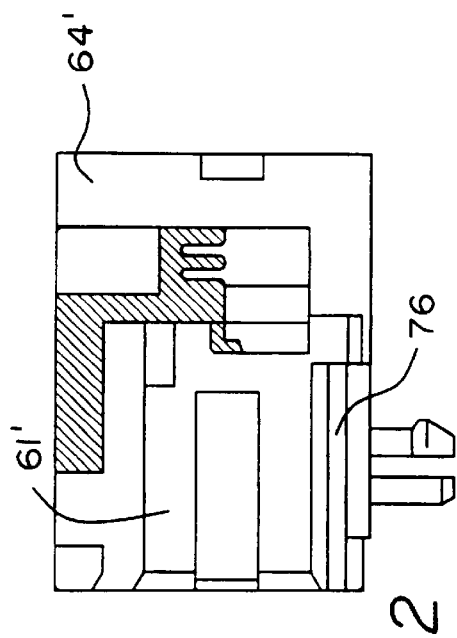
FIG. 12 is a cross-sectional side view of an assembled connector constructed in accordance with the principles of the third preferred embodiment of the invention.
Figure 13B:
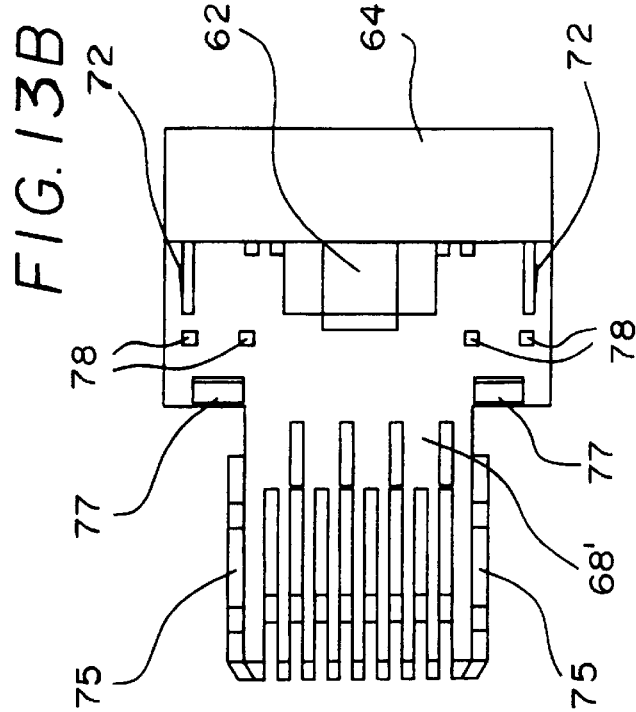
FIGS. 13A–13B are respective side and top views of a secondary housing for the third preferred embodiment of the invention.
Figure 11:
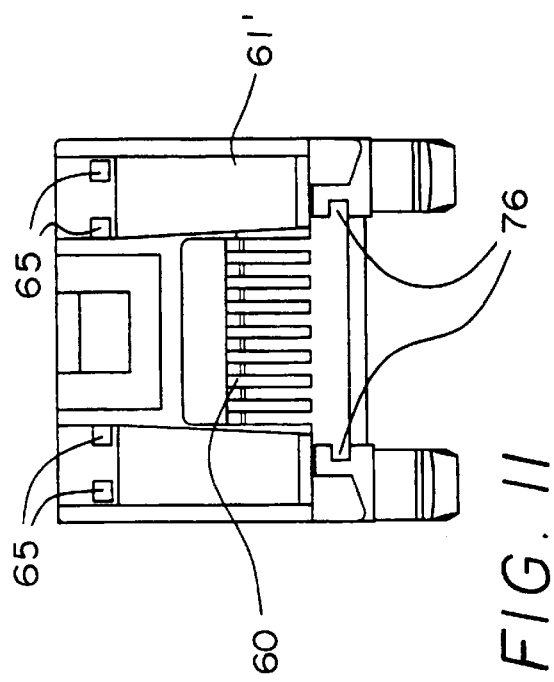
FIG. 11 is a rear view of a main housing constructed in accordance with the principles of a third preferred embodiment of the invention.
Figure 13A:
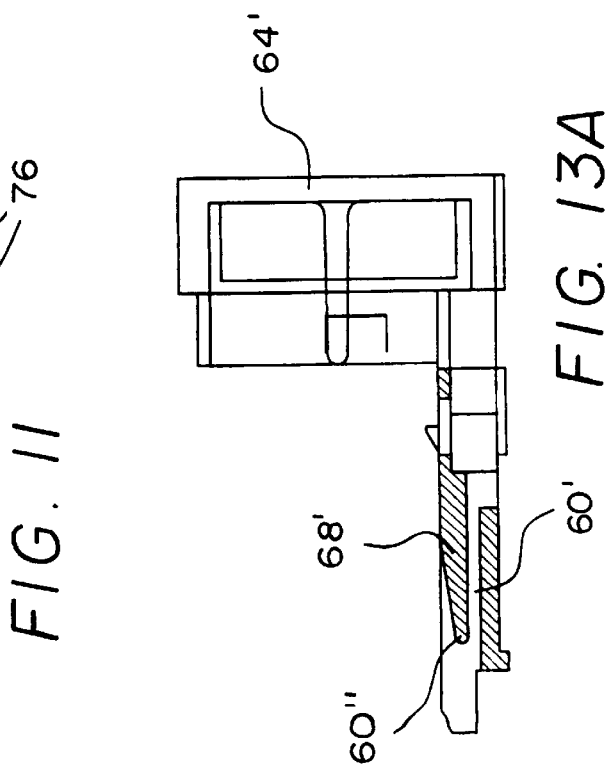

The wiring for the filter and transformer structures of the present invention may be identical or similar to those disclosed in parent application Ser. No. 08/657,209, filed Jun. 3, 1996, and a detailed description is therefore omitted. The principal difference between the embodiment disclosed in the parent application and the embodiments disclosed herein is that the filter and transformer structures are preferably in the form of prewired cores having windings which are connected to each other to obtain the desired filter and/or transformer circuits via terminals extending through the base of the connector, the terminals including PCB tails for interconnection via traces on the circuit board.

Examples of inductor and transformer cores which may be used in connection with the preferred embodiment of the invention are schematically represented in FIG. 2. The cores illustrated in FIG. 2 include a pair of choke or inductor cores 20 and 21 having respective windings 22 and 23, and transformer cores 24 and 24' including primary windings 25 and 25' and secondary windings 26 and 26'. As illustrated, the choke cores have a horizontal orientation and the transformer cores have a horizontal orientation, although those skilled in the art will appreciate that the orientation and position of the cores may be varied as necessary to fit within the connector, and that the number and configuration of the cores and windings may be varied as necessary to meet the electrical requirements of the connector in which they are to be used, including the use of multiply tapped windings and non-toroidal core structures. While the cores are preferably each made up of a magnetic material such an a ferrite material, the material of the different cores may have different magnetic properties based on their different functions.

In the embodiment of FIGS. 3, 5A–5G, 6, and 7, the cores are connected to each other, to the connector contacts, and to circuitry on the circuit board on which the connector is Situated by contacts 30 extending upwardly from the base 31 of the connector housing, the housing also including a main housing 32 and a secondary housing 33. Some of the contacts 30 extend through the base to form PCB tails 30' which connect with traces on the circuit board, while others directly connect windings on adjacent cores and are not terminated to the circuit board. In addition, the terminals may take a variety of forms, including the illustrated clamp contact structures as well as, for example, straight pins, with the terminal interconnections having been omitted from the illustrated connector in the interest of clarity.

While those skilled in the art will easily be able to provide proper traces and connections as required to form circuits such as the one illustrated in the parent application Ser. No. 08/657,209, in the illustrated embodiment, two contacts a and b of the forward row of contacts 30, as shown in FIGS. 5C–5E, include a PCB tail 30' for connection to traces on the circuit board to which the connector is mounted, while all of the contacts 30 in the second row include PCB tails 30'.

The main housing 32 of this embodiment includes a standard RJ connector opening 34 for receiving a mating plug connector, openings 35 and 36 for receiving LEDs 37 and 38, and notches 39 in the side walls of the main housing for receiving portions 39' of bass 31, which forms the bottom wall of the main housing.

Base 31 includes a slotted front portion 40 for supporting RJ contacts 41, each of which includes an oblique suction 42 for engaging a corresponding contact of the mating connector, a horizontal section 43 which passes through a passage 44 provided in the base, and either an upwardly extending vertical section 45 as illustrated in FIG. 5B or a downwardly depending vertical section 46 as illustrated in FIG. 5A. Vertical sections 45 extend upwardly from the base to serve as terminals for the windings of the choke coils, with slots 47 being provided to facilitate bending of the contacts to form the vertical sections 46, while vertical sections 46 extend downwardly and are directly terminated to the circuit board on which the connector is situated. As is known, bending of the front mating portions of the contacts may be facilitated by a lip 48 at the front of the passages.

While the illustrated connector uses standard RJ contacts, however, it will be appreciated by those skilled in the art that the farm of the mating portions of the contacts is not essential to the invention, and may be varied without departing from the scope of the invention. For example, it is possible that the contacts could take the form of cantilevered contacts extending horizontally from the rear of the plug opening.

Alignment between the base 31 and main housing 32 may be achieved by providing ribs 49 on the front section, and corresponding grooves 50 in the main housing In addition, the base may be secured to the main housing by a wide variety of means, including but not limited to the illustrated tab and slot arrangement, in which tabs 51' are provided on the base and arranged to snap into openings (not shown) in the housing as ribs 49 are inserted into slots 50.

The base 31 is also aligned with the secondary housing 33 by a slot and groove arrangement including ribs 51 provided on a rear portion 52 of the base and slots 53 provided in the secondary housing for receiving ribs 50. While it is within the scope of the invention to provide a means for securing the base directly to the secondary housing, in the illustrated example, the secondary housing includes a forward extension 54 provided with resilient tab 55 for engaging corresponding opening 55' in the top wall of the main housing 32, and openings 55" for engaging tabs (not shown) thereby providing an example of a means for securing the main housing to the secondary housing. The securing means could of course also take the form of adhesives, screws, and numerous other mechanical fastening arrangements known to those skilled in the art, all of which are to be considered equivalent for purposes of the invention.

Finally, as shown in FIGS. 3 and 5A–5G, horizontal bores (not shown) extending rearwardly from the LED openings are included in both the main and secondary housings to permit passage of the LED leads 56. At the rear of the secondary housing, leads 56 are bent either downward for passage through openings 57 in the secondary housing and openings 58 in the base to permit electrical connection of the LEDs to the circuit board or connected to contacts 56' of the type shown in FIG. 4, which are inserted through openings 57 and 58. In addition, base 31 and/or main housing 32 may include conventional board locks 59 to facilitate attachment of the base and/or main housing to the circuit board on which the connector is mounted.

It will of course be appreciated by those skilled in the art that the inclusion of such features as LEDs and board locks are not essential to the invention, and may be omitted without departing from the scope of the invention. In addition, the position of the LED leads as well as the other pins on the base module may be varied as necessary to achieve desired connections within the spirit of the invention.

In the second preferred embodiment of the invention, illustrated in FIGS. 8A–8B, 9, and 10A–10C, the mating contacts 60 are mounted in the main housing 61 in conventional fashion by means of passages 61' and lip 61', and the transformers and chokes are mounted on a spindle 62 extending horizontally from the rear wall 63 of the connector secondary housing 64 to reduce the overall length of the connector structure. In this embodiment, passages 65 for the leads 66 or LEDs 67 are provided in the main housing rather than in the secondary housing, while the secondary housing includes a base extension 68 having slots 69 to accommodate the downwardly extending portions of contacts 60 and slots 70 for the transformer contacts 71. Also included in the secondary housing are flanges 72 and 73 for interengagement with the main housing 61 in order to secure the secondary housing to the main housing, and board locks 74.

The third preferred embodiment of the invention, illustrated in FIGS. 11, 12, 13A, and 13B is identical to the second preferred embodiment, except that the support structure for mating contacts 60, including passages 60' and lip 60", is provided on the extension 68' of the secondary housing 64', in a manner similar to front portion 40 of the first preferred embodiment of the invention, with alignment between the main housing portion 61' and secondary housing portion 64' being provided by ribs 75 on extension 68' and grooves 76 in the main housing. This embodiment also includes tabs 77 for cooperation with slots (not shown) in the main housing to secure the secondary housing to the main housing. Again, a spindle is provided to support the transformers and chokes, and the passages for vertical extension of the LED leads are provided in the main housing rather than secondary housing, so that the side view of the main housing shown in FIG. 8A and the front view of the secondary housing shown in FIG. 10C are also applicable to this embodiment. While the LED leads 66 extend downward through the main housing as in the second preferred embodiment of the invention, however, in this embodiment, the leads also extend through openings 78 in the floor of the secondary housing.

Figure 14A:
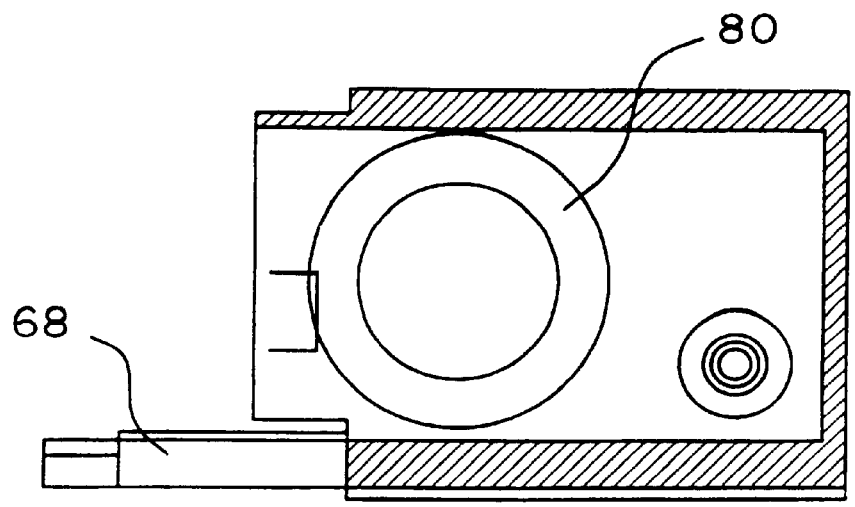
FIGS. 14A and 14B are respective side and top views of secondary housing constructed in accordance with the principles of a fourth preferred embodiment of the invention.
Figure 14B:
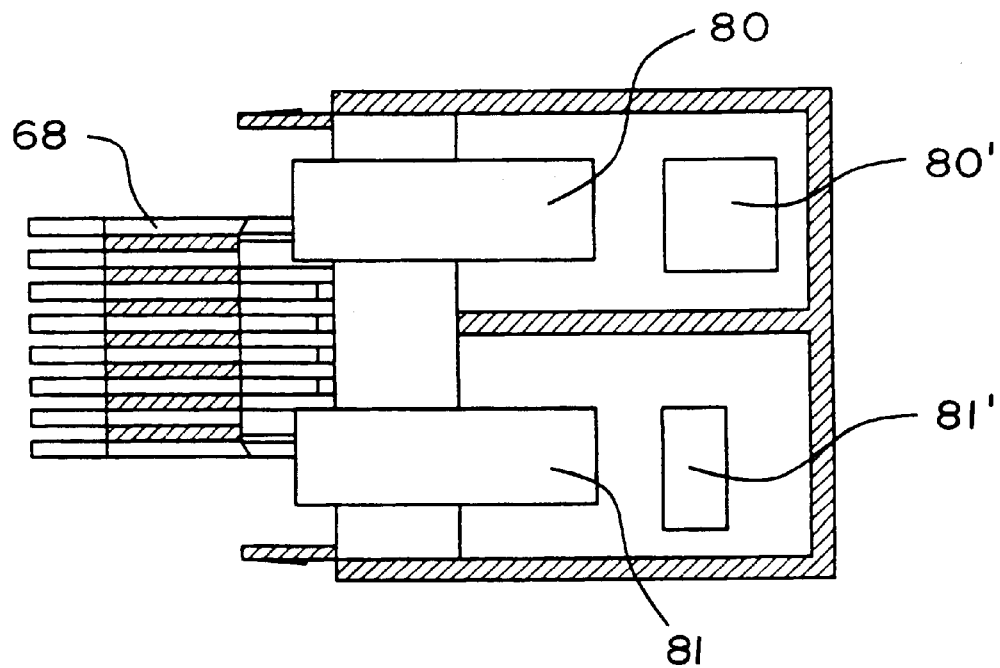
Figure 15A:
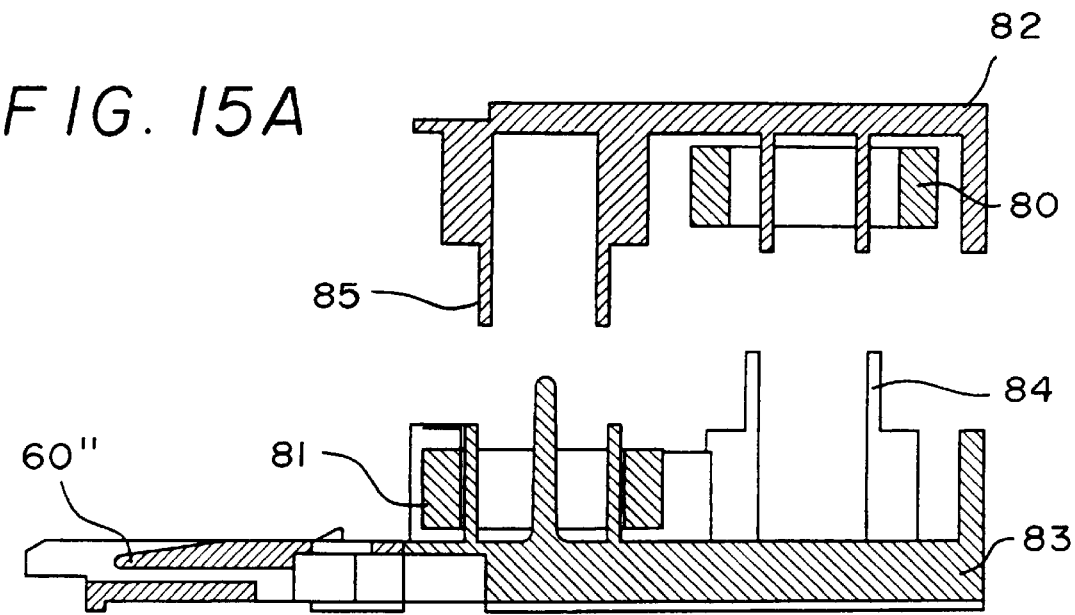
FIGS. 15A and 15B are respective side and top views of the secondary housing constructed in accordance with the principles of a fifth preferred embodiment of the invention.
Figure 15B:
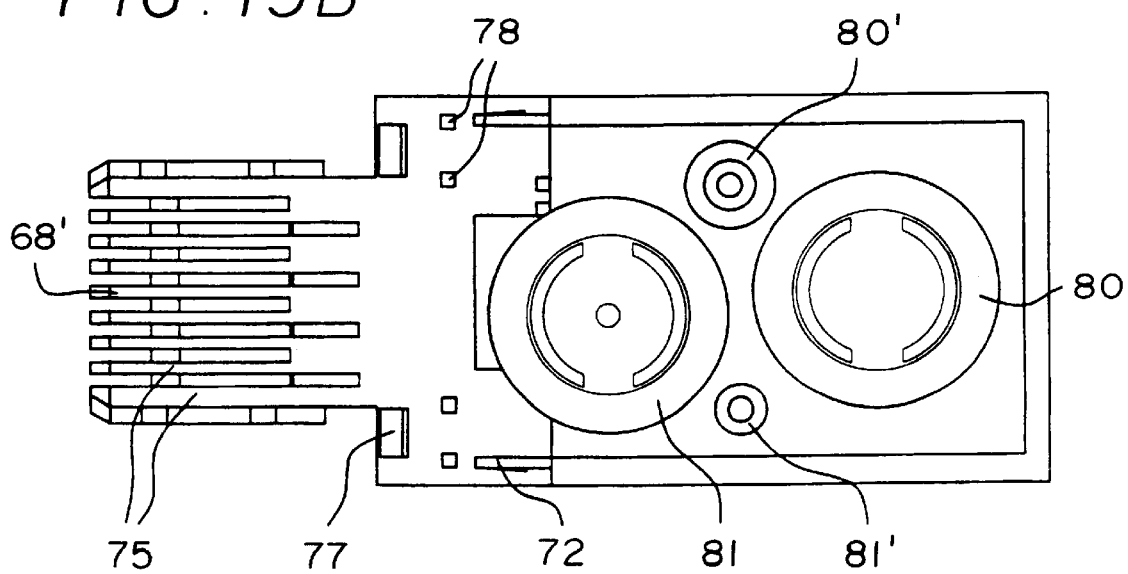
Figure 16A:
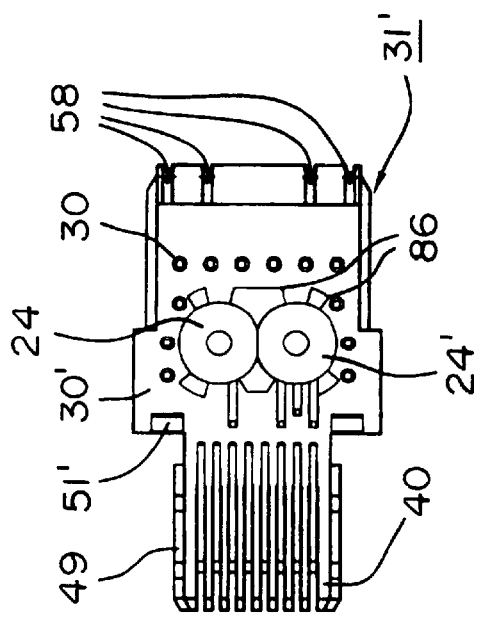
FIGS. 16A and 16B are respective side and top views of a portion of a base assembly constructed in accordance with the principles of a sixth preferred embodiment of the invention.
Figure 16B:
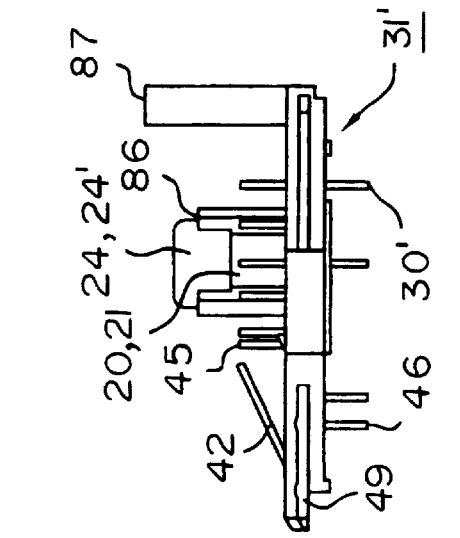
Figure 18:
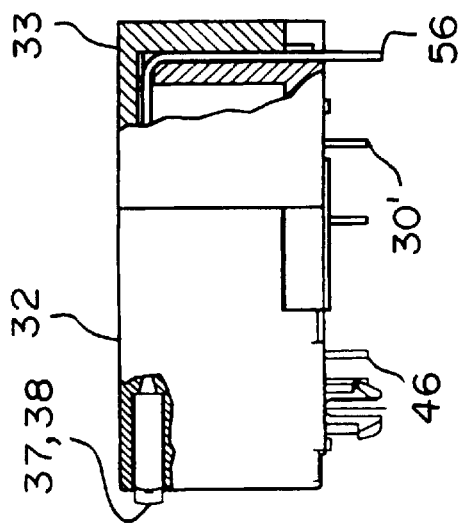
FIG. 18 is a side view of the assembled connector of the sixth preferred embodiment.
Figure 17:
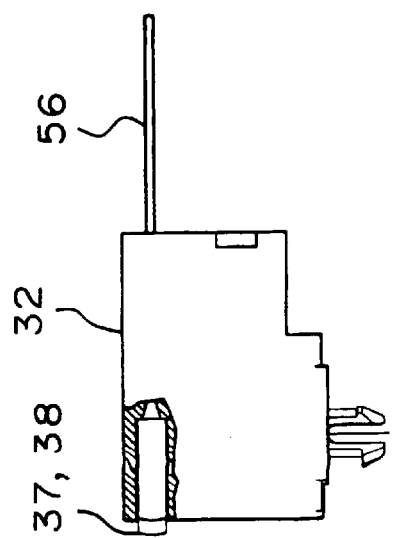
FIG. 17 is a side view of a main housing for the connector of the sixth preferred embodiment.

The fourth preferred embodiment of the invention, illustrated in FIGS. 14A and 14B is identical to that of the first preferred embodiment of the invention, except that the inductor/filter structure 80 and 81 as well as transformers 80' and 81' are mounted vertically in the secondary housing. Similarly, the fifth preferred embodiment of the invention (FIGS. 15A–15B) is similar to that of the fourth preferred embodiment except that the secondary housing is formed from two parts 82 and 83 and includes vertical spindles 84 and 85 for respectively horizontally mounting the transformers 80' and 81' and inductor structures 80 and 81.

Finally, the sixth preferred embodiment of the invention uses a base and housing structure similar to that of the first preferred embodiment of the invention, including a base 31', main housing 32, and secondary housing 34. Main housing 32 and secondary housing 33 may be identical to the corresponding elements of the first preferred embodiment, except that the length of secondary housing 34 is reduced by amount corresponding to the reduction in length of the base 31' relative to base 31, achieved by modifying base 31 of the first preferred embodiment to include stepped component mounting posts 86 which permit stacking of transformers 24 and 24' above chokes 20 and 21. In addition, the embodiment illustrated in FIGS. 16A, 16B, 17 and 18 utilizes a bent structure for the LED leads 56, in which the leads initially extend rearwardly from the rear of main housing 32 and are beat over LED supports 87 extending upwardly from base 31' to fit through openings 58 in the base during assembly of the base to the main housing, and before assembly of the secondary housing 33 to the main housing to complete the connector. It will of course be appreciated that the stepped post structure of this embodiment may be used with the LED lead structure of the first preferred embodiment, or in connection with any of the other preferred embodiments of the invention, and that the LED lead structure of this embodiment may also be used with any of the first through sixth embodiments of the invention.

Those skilled in the art will also appreciate that the front-to-rear dimension of the interior of the secondary housing in the various embodiments may be larger than that of the corresponding chamber in the conventional connector illustrated in FIG. 1C so as to accommodate two cores rather than a single core. In general, at least in interface cards, it is the width and height of the connector that is more limited than the depth, and thus there is some freedom to adjust the dimensions of the connector as necessary. It will further be appreciated by the skilled artisan that the illustrated design could easily be adapted for use with contacts arranged to extend from the top rather than the bottom of the plug receiving chamber.

Assembly of the illustrated connector simply involves winding the appropriate core- structures, positioning the core structures on the base module or base extension of the secondary housing of the connector and, if required, positioning the base module within the secondary housing, connecting the leads of the windings to terminals on the base or in the secondary housing, and securing the main and secondary housings together (and adding LEDs if desired), with the base captured in between in the case of the embodiment of FIG. 3.

Having thus described a preferred embodiment of the invention with sufficient particularity to enable those skilled in the art to easily make and use the invention, and having described several possible variations and modifications of the preferred embodiment, it should nevertheless be appreciated that still further variations and modifications of the invention are possible, and that all such variations and modifications should be considered to be within the scope of the invention. For example, the base module of the connector in any of the illustrated embodiments could be integral with the secondary housing. Also, instead of mounting the cores on the base of the connector or on a spindle, the cores could be mounted on a printed circuit board within the connector, the general concept of using the connector itself to secure the cores could be extended to apply to filters other than the exemplary filter illustrated in the drawings, and other circuit elements could be added to the illustrated circuits.

Accordingly, the scope of- the invention should not be limited by the above description, but rather should be interpreted solely in accordance with the appended claims.

I claim:

1. An electrical connector, comprising:

an electrical connector housing having an opening arranged to receive a mating connector;

a mating contact positioned within said housing and including a front section that extends into said opening, said front section of said mating contact being arranged to engage a corresponding contact of the mating connector received in said opening;

at least one core structure positioned within said housing and having a winding, wherein said housing includes a base to which a discrete first electrical terminal is fixed, wherein said winding of said core structure is electrically connected to said discrete first electrical terminal, and wherein said discrete first electrical terminal is also electrically connected to said mating contact, whereby said winding is electrically connected to said mating contact via said discrete first electrical terminal without the need for inclusion of a printed circuit board in said electrical connector housing.

2. A connector as claimed in claim 1, wherein said mating contact is supported by said main housing.

3. A connector as claimed in claim 1, wherein said mating contact is supported by an extension of said secondary housing.

4. A connector as claimed in claim 1, wherein said secondary housing includes top and bottom halves having respective downward and upward extensions which cooperate to form a spindle for said first core structure when the top and bottom halves are assembled together to form the secondary housing.

5. An electrical connector as claimed in claim 1, further comprising at least a second core structure, said second core structure having a winding electrically connected to the winding of the first core structure.

6. An electrical connector as claimed in claim 1, further comprising at least a second core structure positioned in said housing and having a winding electrically connected to the winding of the first core structure said electrical connection being effected by electrically connecting the winding of the first core structure to a second terminal fixed to the housing, and by also electrically connecting the first winding to said second terminal, thereby electrically connecting said first and second windings without the need for inclusion of a printed circuit board in said electrical connector housing.

7. An electrical connector as claimed in claim 6, wherein said second winding is electrically connected to PCB tails extending from said housing by a third terminal fixed to the housing.

8. An electrical connector as claimed in claim 1, wherein said connector housing comprises:

a main electrical connector housing having said opening arranged to receive a mating connector;

a secondary connector housing; and means for securing the main electrical connector housing to the secondary connector housing, and wherein said first core structure is positioned within the secondary connector housing, and said terminal is fixed to one of said main and said secondary housings.

9. A connector as claimed in claim 8, wherein said terminal is fixed to a base which is arranged to be secured to said main housing and said secondary housing during assembly of the connector.

10. A connector as claimed in claim 9, wherein said base includes ribs engageable with slots in said main and secondary housings to align said base with said main and secondary housings.

11. A connector as claimed in claim 10, wherein said base is integral with said secondary housing.

12. A connector as claimed in claim 10, wherein said mating contact is one of a plurality of RJ contacts each having a mating section extending obliquely into said opening, a horizontal section extending from the mating section through a passage in said base, and a vertical section extending from the horizontal section.

13. A connector as claimed in claim 10, wherein said vertical sections of some of said RJ contacts form PCB tails and a vertical section of at least one other of said contacts extends upwardly to form said terminal.

14. A connector as claimed in claim 8, wherein said secondary housing includes means for supporting said first core structure.

15. A connector as claimed in claim 14, wherein said first core structure is a transformer core.

16. A connector as claimed in claim 14, wherein said first core structure is a transformer and further comprising a choke coil structure positioned in said secondary housing, a winding of said choke coil also being electrically connected to said terminal.

17. A connector as claimed in claim 16, wherein said transformer and choke coils are positioned such that axes of said coils are vertical.

18. A connector as claimed in claim 16, wherein said transformer and choke coils are positioned such that axes of said coils are horizontal.

19. A connector as claimed in claim 1, further comprising at least one LED visible from a front of said main housing and having leads extending through said main housing.

20. A connector as claimed in claim 19, wherein said leads of the LED also extend through the secondary housing to form PCB tails extending from a bottom of the secondary housing.

\* \* \* \* \*